United States Patent
Lonati et al.

(10) Patent No.: US 9,534,324 B2
(45) Date of Patent: Jan. 3, 2017

(54) PROCESS FOR MANUFACTURING KNITWEAR, HOSIERY TEXTILE ITEMS OR SEAMLESS ITEMS WITH VARIABLE COMPRESSION

(71) Applicant: SANTONI S.P.A., Brescia (IT)

(72) Inventors: Andrea Lonati, Brescia (IT); Lorenzo Favardi, Botticino Sera (IT)

(73) Assignee: SANTONI S.P.A., Brescia (IT)

( * ) Notice: Subject to any disclaimer, the term of this patent is extended or adjusted under 35 U.S.C. 154(b) by 0 days.

(21) Appl. No.: 14/688,407

(22) Filed: Apr. 16, 2015

(65) Prior Publication Data
US 2015/0308021 A1    Oct. 29, 2015

(30) Foreign Application Priority Data

Apr. 24, 2014 (IT) .............................. BS2014A0087

(51) Int. Cl.

| | |
|---|---|
| *G06F 19/00* | (2011.01) |
| *D04B 1/26* | (2006.01) |
| *D04B 1/18* | (2006.01) |
| *D04B 1/24* | (2006.01) |
| *D04B 15/50* | (2006.01) |
| *D04B 9/46* | (2006.01) |
| *D04B 15/58* | (2006.01) |

(Continued)

(52) U.S. Cl.
CPC . *D04B 1/26* (2013.01); *D04B 1/18* (2013.01); *D04B 1/246* (2013.01); *D04B 9/46* (2013.01); *D04B 15/50* (2013.01); *D04B 15/58* (2013.01); *D04B 37/02* (2013.01); *G06F 17/5009* (2013.01)

(58) Field of Classification Search
CPC ............. D04B 1/18; D04B 1/26; D04B 1/265; D04B 9/46; D04B 9/48; D04B 9/50; D04B 9/52; D04B 15/58
USPC ......................................................... 700/141
See application file for complete search history.

(56) References Cited

U.S. PATENT DOCUMENTS

| | | | | |
|---|---|---|---|---|
| 4,502,301 A | * | 3/1985 | Swallow ................. | A61F 13/08 602/62 |
| 4,527,402 A | * | 7/1985 | Swallow ................. | A61F 13/08 2/239 |
| 7,441,419 B1 | | 10/2008 | Dollyhite et al. | |

(Continued)

FOREIGN PATENT DOCUMENTS

WO    2008/004345 A1    1/2008

*Primary Examiner* — Nathan Durham
(74) *Attorney, Agent, or Firm* — Pearne & Gordon LLP

(57) ABSTRACT

A process for manufacturing knitwear, hosiery textile items or seamless items with variable compression on circular weft knitting machines, comprising the steps of activating a program for manufacturing a textile (6); manufacturing a textile item (6); and changing the tension of an elastic yarn (9) fed to the needles (4) by a first feeding device (8) of a predefined value of variation and for a predefined number of times, corresponding to at least two times within the same knitting row during the production of the textile, so as to define in said knitting row of the textile a corresponding predefined number of distinct knitting row portions having a differentiated yarn tension, corresponding to at least two portions of the same knitting row; the step of changing the tension of such a yarn being performed independently from the knitted structure produced and also independently from a variation in the position of the stitch adjusting cams (7).

16 Claims, 3 Drawing Sheets

(51) Int. Cl.
*D04B 37/02* (2006.01)
*G06F 17/50* (2006.01)

(56) References Cited

U.S. PATENT DOCUMENTS

| | | |
|---|---|---|
| 2004/0016043 A1 | 1/2004 | Uno et al. |
| 2005/0049741 A1* | 3/2005 | Dias .................. D04B 7/32 700/141 |
| 2010/0130903 A1 | 5/2010 | Rock |
| 2012/0024014 A1* | 2/2012 | Fukui .................. D04B 1/102 66/171 |
| 2015/0245951 A1* | 9/2015 | Convert ............... A61F 13/08 66/178 A |

* cited by examiner

PROCESS FOR MANUFACTURING KNITWEAR, HOSIERY TEXTILE ITEMS OR SEAMLESS ITEMS WITH VARIABLE COMPRESSION

The present invention relates to a process for manufacturing knitwear, hosiery textile items or seamless items with variable compression on circular weft knitting machines. The invention further relates to a circular weft knitting machines for knitwear, hosiery and seamless items configured for implementing such a process. Modern circular weft knitting machines are highly automated and work according to specific knitting programs, thus enabling to automatically produce several types of textile items, among which hosiery, knitwear, seamless items and the like, etc. As is known, the types of yarn used for manufacturing textile items are mainly divided into: traditional, non-elastic yarns, such as e.g. natural fibers (cotton, wool, etc.), artificial fibers (viscose, cuprammonium rayon, etc.), synthetic fibers (polyamide, polypropylene, polyester, etc.), either texturized or not; elastic yarns, among which bare elastomeric yarns (i.e. not coated with other materials, e.g. bare spandex or bare elastam) and coated elastomeric yarns (e.g. spandex or elastam coated with cotton, polyamide, polypropylene, polyester or other). The use of elastic yarns, such as bare or coated elastomeric yarns, together with conventional, non-elastic fibers enables to obtain fabrics with a given elasticity and thus to obtain effects of compression and fitting of the textile to the human body. Moreover, various types of yarn feeding devices are known, each of them being more suitable for specific types of yarns. For conventional, non-elastic yarns, for instance passive or "défilé" feeding devices can be advantageously used, such as fixed drum or rotatable reel devices. Rotatable reel feeding devices can further be advantageously used for coated or bare elastic yarns. The most suitable devices for bare or uncoated elastic yarn feeding are active feeding devices, also known as PYFs (positive yarn feeders) or "déroulé" feeders. It is further known that in the textile field there is also the need to manufacture textile items with knitted areas having differentiated properties, e.g. so as to provide different specific compression degrees for the different anatomical parts of the users' body or to better fit to such anatomical areas, thus also shaping the item accordingly. Such differentiated areas are provided for instance so as to obtain items of clothing that are more shaped and suitably fitted to the users' body, as support and/or target compression areas. In order to obtain areas with differentiated compression, various technical solutions have been proposed at the state of the art. It is traditionally known e.g. to manufacture textile items with differentiated areas by manual or partially automated assembly of different portions of fabric of different type, which are cut and then sewn in order to obtain the desired items. These solutions, however, cannot be applied to seamless items and require several additional operations in order to produce such items, thus proving complex and expensive. Therefore, the presence of seams on the finished item negatively affects the comfort and functional properties of the item. Another known solution consists in varying the size of the grafting stitch so as to obtain areas with different stitching properties. As a rule, this solution is implemented by changing the positions of the stitch adjusting cams, which are moved so as to change the needle travel and therefore the size of the grafting stitch thus made. This technical solution can also be applied to seamless items, but it does not allow to obtain results in terms of variation of the elasticity properties of the fabric for the compression and enables to obtain very limited results in terms of shaping of the different areas of the textile. Moreover, the size variation of the grafting stitch for purposes of elasticity and compression or recovery force may reduce or block elasticity, thus causing opposite effects to the idea of elasticity and compression or recovery force which the fabric should have, and as far as shaping is concerned, it generally also has secondary, potentially unwanted effects on the fabric, such as a variation of stitch density, an aesthetic discontinuity of the fabric, etc. Another known solution consists in varying the type of knitted structure produced by the machine so as to obtain areas with different properties, by using various types of known knitted structures. As a rule, this solution is implemented by changing the positions of the cams (cam of tuck stitch, cam of unloaded stitch, etc.) and/or by actuators or selection blocks, so as to modify the needle trajectories and thus the type of stitch obtained. This technical solution can also be applied to seamless items, but it allows to obtain only very limited results in terms of variation of the elasticity properties for the compression and shaping of the various areas of the textile. Moreover, the change of the knitted structure for purposes of elasticity and compression and recovery force, due to the welts caused by the different knitted structures, may reduce or block elasticity, thus causing opposite effects to the idea of elasticity and compression and recovery force which the fabric should have, and as far as shaping is concerned, it generally also has secondary, potentially unwanted effects on the fabric, such as an aesthetic discontinuity of the fabric, a discontinuity in the fabric thickness etc. Moreover, this solution often involves the use of at least two yarns for each feed, one elastic yarn and one non-elastic yarn.

Another known solution consists in inserting elastic yarns into the fabric only at given fabric areas, or in replacing a type of elastic yarn with another type of elastic yarn during the production of the textile, also by changing the yarn feeding device supplying the machine with the yarn, always with the purpose of obtaining areas with differentiated compression. These solutions, however, require particular manufacturing expedients, among which e.g. special equipment, a slower manufacturing process enabling yarn insertion or change, and thus result in downtime and above all inhomogeneous areas or even fabric defects. Moreover, such solutions enables to obtain only limited effects on large fabric areas, but a sufficient variety of small differentiated areas cannot be obtained. The known solutions therefore have various drawbacks, as explained above. The technical task of the present inventions consists in obviating one or more of the drawbacks mentioned above. Moreover, the invention aims at providing a process enabling to manufacture textile items variously shaped according to the different needs so as to fit to the body of every user. Another aim of the invention consists in providing a process enabling to manufacture textile items having areas with differentiated compression, potentially also several small areas, apt to provide containment and compression effects on the various body areas that are very different and suitable to many different needs. A further aim of the invention consists in providing a process enabling to obtain seamless textile items that are shaped and have areas with differentiated compression. Another aim of the invention consists in providing a process enabling to automatically obtain from the knitting machine textile items that are shaped and have areas with differentiated compression, without the need for manual cutting and sewing operations for finishing purposes. A further aim of the inventions consists in providing a process enabling to simplify the programming process for the textile and for its areas with differentiated compression. Another aim of the invention consists in providing a process enabling to minimize the need for manual interventions performed by the operators. A further aim of the invention consists in providing a process enabling to ensure high quality and accuracy in the production of the textile items, for instance by avoiding fabric defects due to a slower machine or to yarn change. Another aim of the invention consists in providing a process enabling to produce textile items in a simple, fast and automatic way. A further aim of the invention consists in providing a process and a knitting machine configured for the execution of such a process, that are simple, robust and cheap to obtain. These and other aims that will be more evident from the following description are basically achieved by means of a process and a circular knitting machine according to the appended claims, in any combination and/or with one or more of the aspects referred to below. Further aspects of the invention are now disclosed and can be considered in combination with any one of the appended claims, alone or in combination. In another aspect, the invention further relates to a process for manufacturing knitwear, hosiery textile items or seamless items with variable compression, wherein a step of changing the tension of the elastic yarn is performed by defining a differentiated elastic yarn tension in adjacent knitting row portions having the same jersey or plain knitted structure.

In another aspect, the invention further relates to a process for manufacturing knitwear, hosiery textile items or seamless items with variable compression, wherein the step of actively changing the feeding tension of the elastic yarn fed to the needles is performed independently from a possible variation of the knitted structure produced and from possible variations in the position of the stitch adjusting cams and/or wherein it is performed by means of the feeding device and/or wherein it is performed by means of one or more of the yarn braking devices. In another aspect, the invention further relates to a process for manufacturing knitwear, hosiery textile items or seamless items with variable compression, further comprising the step of varying also the type of knitted structure, by actuating the cams, at or near at least one variation of elastic yarn tension. In another aspect, the invention further relates to a process for manufacturing knitwear, hosiery textile items or seamless items with variable compression, wherein the step of changing the elastic yarn tension is performed by selectively increasing and decreasing the elastic yarn tension in an alternating manner within every knitting row, alternating an increase with a respective successive decrease. In another aspect, the invention further relates to a process for manufacturing knitwear, hosiery textile items or seamless items with variable compression, wherein the step of changing the elastic yarn tension is performed by selectively increasing and decreasing the elastic yarn tension in an alternating manner within every knitting row, alternating at least two consecutive increases with at least two respective successive consecutive decreases, or at least three consecutive increases with at least three respective successive consecutive decreases. In another aspect, the invention further relates to a process for manufacturing knitwear, hosiery textile items or seamless items with variable compression, wherein every increase is directly or indirectly followed by a respective decrease with the same predefined absolute value of variation of elastic yarn tension. In another aspect, the invention further relates to a process for manufacturing knitwear, hosiery textile items or seamless items with variable compression, wherein the increases have respective predefined values of variation differing from each other. In another aspect, the invention further relates to a process for manufacturing knitwear, hosiery textile items or seamless items with variable compression, wherein at least one portion of the textile, which portion has been produced according to one of the claims or aspects referred to, is manufactured only with one or more elastic yarns. In another aspect, the invention further relates to a process for manufacturing knitwear, hosiery textile items or seamless items with variable compression, wherein the textile is manufactured according to one of the claims or aspects referred to and only with one or more elastic yarns. In another aspect, the invention further relates to a process for manufacturing knitwear, hosiery textile items or seamless items with variable compression, wherein the increases and decreases are repeated in the same sequence at a plurality of consecutive knitting rows, carrying out the variations of the yarn tension in each row at a same point of the textile. In another aspect, the invention further relates to a process for manufacturing knitwear, hosiery textile items or seamless items with variable compression, wherein the increases and decreases are repeated in the same sequence at a plurality of consecutive knitting rows by carrying out the variations of the tension of the elastic yarn in each row at variable points of the textile so as to define shaped portions with variable compression on the textile. In another aspect, the invention further relates to a process for manufacturing knitwear, hosiery textile items or seamless items with variable compression, which process is implemented on a knitting machine comprising a plurality of first devices for feeding an elastic yarn, operatively active so as to provide the elastic yarn on respective feeds, and including the step of varying the tension of the elastic yarn fed by the first feeding devices simultaneously or with a time offset. In another aspect, the invention further relates to a process for manufacturing knitwear, hosiery textile items or seamless items with variable compression, which process is implemented on a knitting machine comprising a plurality of first devices for feeding an elastic yarn, operatively active so as to provide the elastic yarn at respective feeds, and including the step of varying the tension of the elastic yarn fed by the first feeding devices according to the same predefined value of variation or according to different predefined values of variation. In another aspect, the invention further relates to a process for manufacturing knitwear, hosiery textile items or seamless items with variable compression, which process is implemented on a knitting machine comprising a plurality of second devices for feeding a non-elastic elastic yarn, operatively active so as to provide the non-elastic yarn and/or wherein at least one portion of the textile, produced according to one of the claims or aspects referred to, is manufactured using both the elastic yarn or yarns and at least one non-elastic yarn, or wherein the textile is manufactured according to one of the claims or aspects referred to above and using both the elastic yarn or yarns and a non-elastic yarn. In another aspect, the invention further relates to a process for manufacturing knitwear, hosiery textile items or seamless items, wherein the step of varying the tension of the elastic yarn fed to the needles within the same knitting row during the production of the textile is repeated for a predefined number of times at a plurality of non-consecutive rows of the textile, so as to define in such a textile a predefined number of knitted fabric portions having a partially differentiated yarn tension. In another aspect, in combination with any one of the claims or aspects referred to below, the invention further relates to a process in which the knitting machine comprises a needle plate operatively cooperating with the needle cylinder, for manufacturing the weft knitted fabric and/or the textile, and corresponding additional stitch adjusting cams operatively active upon the additional needles of the needle plate. In another aspect, the invention further relates to a process for manufacturing knitwear, hosiery textile items or seamless items with differentiated compression, wherein the production is executed with a continuous movement of the needle cylinder. In another aspect, the invention further relates to a process for manufacturing knitwear and hosiery textile or seamless items with differentiated compression, wherein the production is executed with an alternating movement of the needle cylinder. In another aspect, the invention further relates to a software for circular weft knitting machines configured for executing a process according to any one of the claims and/or aspects disclosed above. In another aspect, the invention further relates to a circular weft knitting machine further comprising at least a second feeding device for a non-elastic yarn, operatively active so as to supply the needles with a non-elastic yarn at a respective feeding position, so as to enable the production of the textile with the elastic yarn and with the non-elastic yarn. Further characteristics and advantages will be more apparent from the detailed description of a preferred, though not exclusive, embodiment according to the accompanying figures, in which:

FIG. 1 schematically shows a circular knitting machine for knitwear, hosiery or seamless items;

FIG. 2 schematically shows some parts of the knitting machine of FIG. 1, and shows in particular a detail of a yarn distaff, of a feeding device and of a corresponding feeding point on which the mobile needles in the cylinder of the knitting machine are supplied with elastic yarn;

Figure 1:
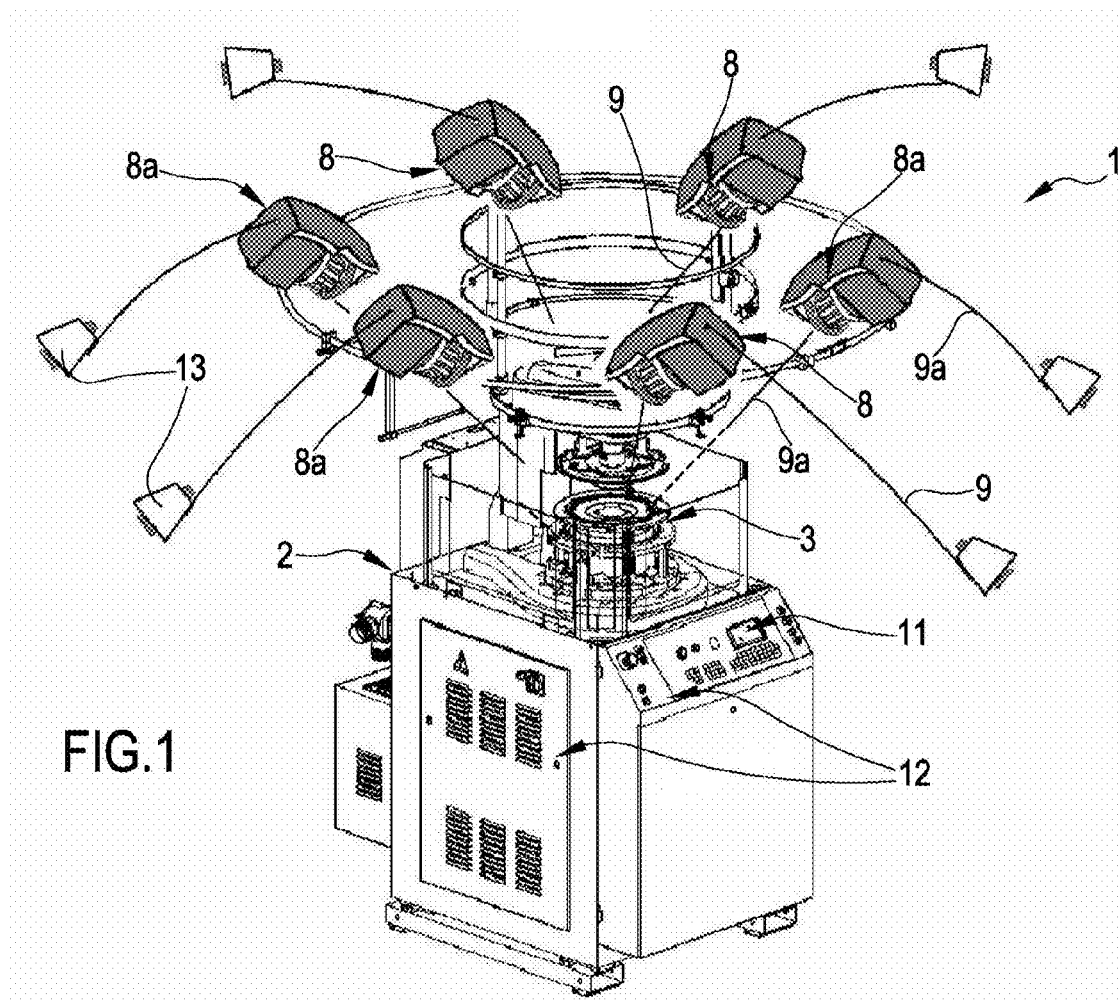
Figure 2:
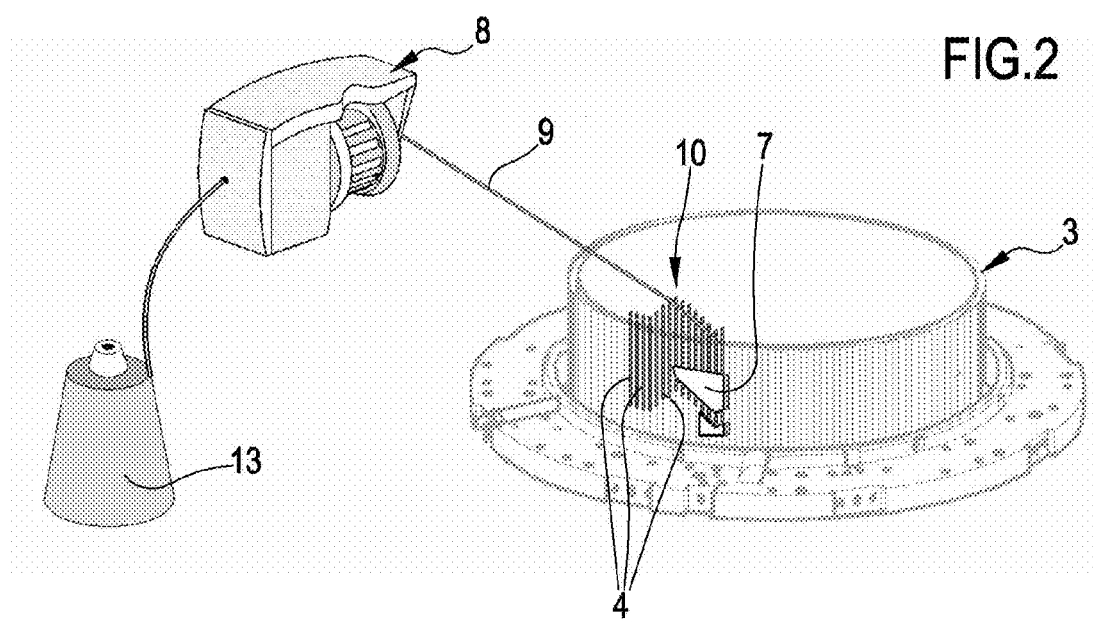
Figure 3:
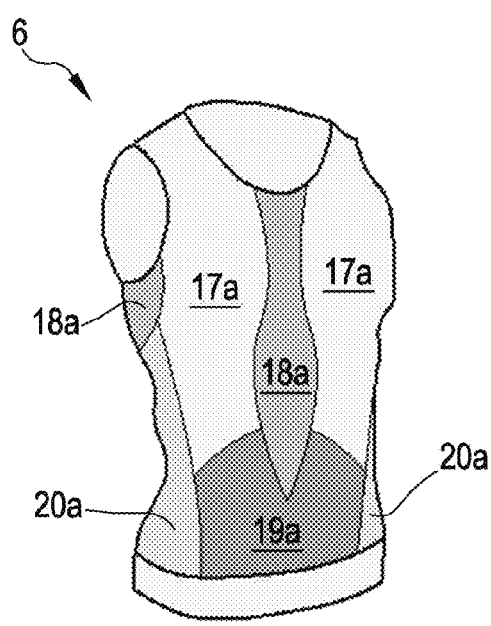
FIGS. 3 and 3A show a front perspective view and a rear perspective view, respectively, of an example of a textile divided in knitted areas with differentiated compression, according to an embodiment of the present invention.
Figure 3A:
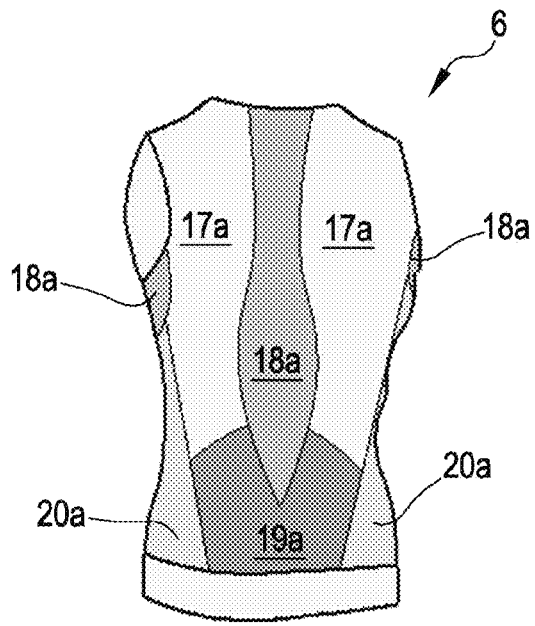

Referring to the figures mentioned above, the numeral 1 was used to globally indicate a circular weft knitting machine for manufacturing hosiery, knitwear and/or seamless items 6. The knitting machine comprises at least a bearing structure 2, a needle cylinder 3 rotatably mounted in the bearing structure 2, and a plurality of needles 4 supported by the needle cylinder 3 and moving parallel to an axis of rotation of the cylinder 3 of the needles 4 so as to produce a weft knitted fabric or textile 6. In the present text, the wording "circular weft knitting machine" refers to a circular knitting machine for the production of knitwear, seamless and/or hosiery textile items having at least one feed or a plurality of feeds or feeding points and corresponding stitch adjusting cams or knitted triangles. The stitch cams can therefore be individually adjusted in an automatic manner, i.e. each cam can be adjusted independently from one another in every predefined knitted area of a manufactured item or textile, and can also be simultaneously adjusted, i.e. all the cams can be adjusted simultaneously in the same manner. Such knitting machines can be for instance with single or double needle bed (i.e. with needle plate or with double cylinder). Such machines can be with continuous or alternating motion. The definition of "circular knitting machine for knitwear or hosiery", however, does not include for the purposes of the present invention circular knitting machines for fabric production known as "meter" machines, i.e. for the continuous production of fabric. Such "meter" knitting machines do not enable an independent, automatic adjustment of the stitch adjusting cams, which are manually adjusted during the initial commissioning of the machine before starting production, and can then be adjusted only simultaneously and not independently from one another. "Meter" knitting machines are generally provided with yarn feeding devices referred to as "active" (or positive) devices, all of which supply the same amount of yarn at each machine feed and are usually actuated directly by the rotation of the knitting machine cylinder through suitable actuating means, all of them feeding the yarn at the same speed related to the rotational speed of the cylinder. Moreover, said "meter" knitting machines generally have a large diameter, i.e. a cylinder diameter above 30 inches. The circular knitting machine 1 can further comprise a plurality of stitch adjusting cams 7 operatively active upon the needles 4, and in particular upon corresponding heels 4*a* of the needles 4, and selectively moving in order to change the movement of the needles 4 and therefore the width of the stitches 5*a* produced by said needles 4. In further detail, the cams 7 can be height-adjusted in a known manner. The circular knitting machine 1 further comprises at least a first feeding device 8 for an elastic yarn 9, e.g. an elastomeric yarn, operatively active so as to supply the needles 4 with an elastic yarn 9 at a respective feeding position 10. The elastic yarn 9 can be coated or uncoated (i.e. bare). The first feeding device can be for instance of passive type with rotatable reel or of "défilé" type. As an alternative, the first feeding device can be for instance of active, PYF (positive yarn feeder) or "déroulé" type. The machine can also comprise different types of feeding devices for different elastic yarns, which can be used together for manufacturing a textile. The machine can comprise a plurality of first feeding devices 8 for an elastic yarn 9, operatively active so as to provide the elastic yarn 9 at respective feeds. The knitting machine can further comprise at least a second feeding device 8*a* for a non-elastic yarn 9*a*, operatively active so as to supply the needles 4 with a non-elastic yarn 9*a* at a respective feeding position 10 and on at least one respective stitch adjusting cam 7, in order to enable the production of the textile both with the elastic yarn 9 and with the non-elastic yarn 9*a*. The second feeding device can be for instance of passive (or negative) type with fixed drum. The term "passive" means that the feeding device works in a manner known in the field as "défilé", i.e. in which the yarn is unwound from the feeding device as a result of the yarn being requested by the knitting machine. The wording "with fixed drum" means that the drum on which the yarn is wound does not move when the yarn is unthreaded for feeding the knitting machine (while the drum can be actuated in rotation so as to gather the yarn from a respective distaff). The passive feeding device with fixed drum enables to prevent "slippages" with several different yarn types, e.g. natural yarns, artificial yarns, textured, parallel synthetic yarns and coated elastic yarns, whereas it is not suitable as a rule for feeding uncoated, so-called bare, elastic yarns. The machine can comprise a plurality of second feeding devices 8*a* for a non-elastic yarn 9*a*, operatively active so as to provide a non-elastic yarn 9*a* at respective feeds. Each feeding device 8 or 8*a* receives the yarn 9 or 9*a* from a respective distaff 13 and supplies with it the needles 4 on the respective feed 10. The circular knitting machine further comprises a control device 11 for the operation of the knitting machine 1 as well as electric and electronic devices 12 connected to the control device 11 and operatively active so as to control the operation of a plurality of parts of the knitting machine and to detect a plurality of operating parameters of the knitting machine 1. The knitting machine 1 can further comprise a needle plate (not shown in the figures since it is of known type), operatively cooperating with the cylinder 3 of the needles 4 for manufacturing the knitted fabric and/or the textile 6, and corresponding additional stitch adjusting cams operatively active upon the additional needles of the needle plate. The components referred to above and the other usual components of the knitting machine 1 are not described in further detail in the present text since they are known per se.

Figure 4:
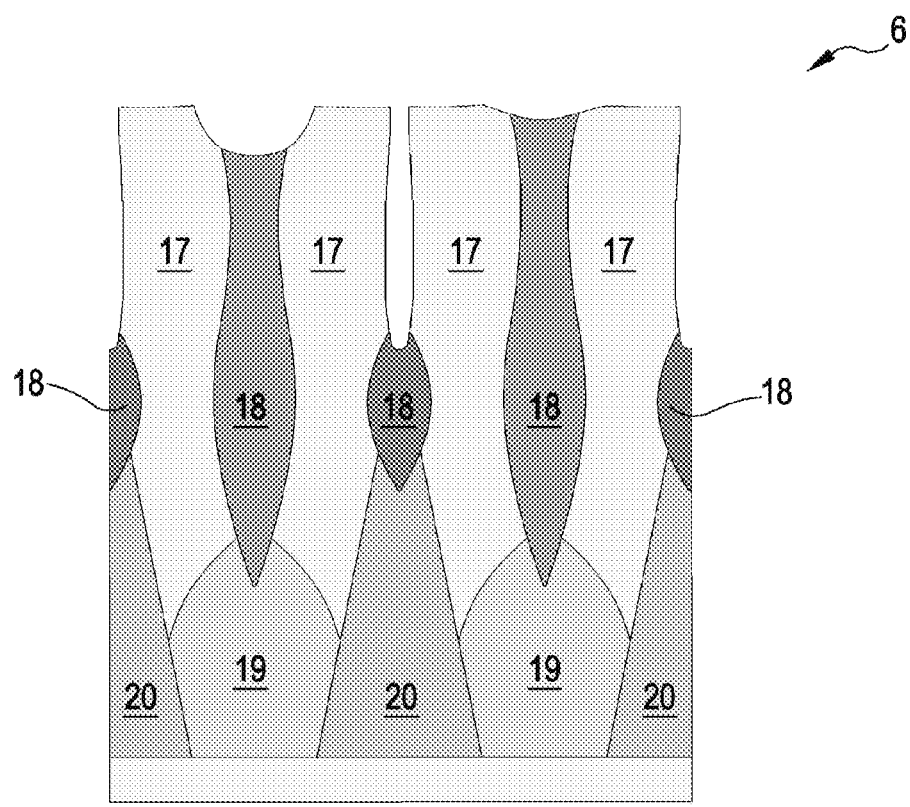
FIG. 4 shows an example of a schematic representation of the textile of FIGS. 3 and 3A, as shown in a design interface of the textile, for enabling a user to schematically define the various areas to be produced with differentiated compression.
Figure 5:
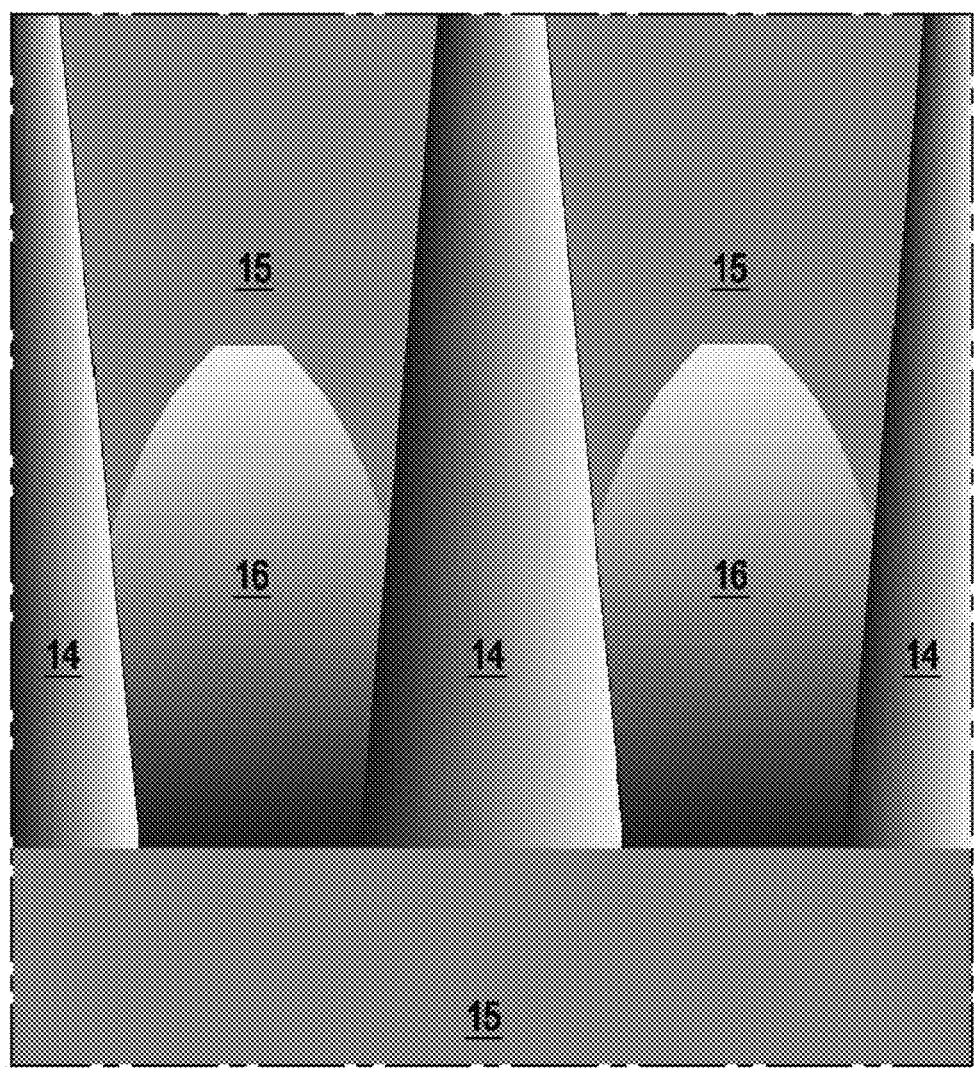
FIG. 5 shows another schematic representation of a textile to be produced with an embodiment of the invention, wherein the yarn tension variations are further schematically shown in each area with color intensity gradations.

According to the present invention, a process for manufacturing knitwear, hosiery or seamless textile items 6 with variable compression on circular weft knitting machines comprises at least the steps of activating a manufacturing program for a knitwear, hosiery or seamless textile 6 on the control device 11 of the knitting machine 1, and of manufacturing a knitwear, hosiery or seamless textile on the knitting machine 1. The process further comprises the step of actively and automatically changing, according to a predefined manufacturing program, the tension of the elastic yarn 9 fed to the needles 4 by the first feeding device 8 of a predefined value of variation and for a predefined number of times, at least two times, within the same knitting row during the production of the textile 6, so as to define in said knitting row of the textile 6 a corresponding predefined number of distinct knitting row portions having a differentiated yarn tension, at least two knitting row portions. In the present text use will be made of the term "tension" of the yarn, including in such a term also the idea of yarn grammage, i.e. the measure in grams of the tension applied to the yarn. The step of changing the tension of the elastic yarn 9 fed to the needles 9 is performed actively, i.e. by an active intervention of devices apt to directly vary yarn tension, such as e.g. the corresponding yarn feeding device, a yarn braking device, a yarn tension adjusting device or the like. Moreover, the step of changing yarn tension is performed whatever the type of knitted structure being manufactured and independently from a variation in the position of the stitch adjusting cams 7. In other words, according to the invention the tension of the elastic yarn, the elasticity and the compression degree obtained in the different areas of the textile can be varied even without changing the knitting structure produced. The step of changing the tension of the elastic yarn 9 is further performed without changing the type of elastic yarn or the yarn feeding device. Preferably, the step of changing the tension of the elastic device 9 is performed without varying the type of knitted structure and defining, within the same knitting row, distinct knitting row portions having the same knitted structure and a differentiated elastic yarn tension. It is thus possible to obtain areas of the textile 6 with differentiated compression, which include two or more portions of the same knitting rows even with a simple stocking stitch or single jersey structure made also with only one yarn per feed. In particular, the step of changing the tension of the elastic yarn can be performed by defining a differentiated elastic yarn tension in adjacent knitting row portions having the same jersey or plain knitted structure. In a variant of embodiment, the process can further include the step of varying also the type of knitted structure, by actuating the cams, on or near at least one variation of elastic yarn tension. The step of changing the tension of the elastic yarn 9 can further be performed for a predefined number of times corresponding to at least three times, or at least four times, or at least five times, or at least six times, within the same knitting row during the production of the textile 6, so as to define in such a knitting row of the textile 6 a corresponding predefined number of knitting row portions having a differentiated yarn tension. Moreover, the tension of the elastic yarn 9 can be varied according to different predefined values of variation at successive variations within the same knitting row so as to define a plurality of knitting row areas with different tensions. For instance, if two distinct knitting row portions having two different respective elastic yarn tensions have to be defined, the tension is varied twice within such a row, first increasing of a certain value and then decreasing of the same absolute value of variation. In a second example, if four distinct knitting row portions having four different respective elastic yarn tensions have to be defined, the tension is varied four times within such a row, preferably with respective increases and corresponding decreases having the same absolute values of variation, but in a variant the increases and decreases could have different absolute values. The predefined value of variation can be for instance at least 1 gram, or at least 2 grams, or at least 5 grams, or at least 10 grams, or at least 20 grams, etc. The step of changing the tension of the elastic yarn 9 within the same knitting row during the production of the textile 6 can be repeated a predefined number of times at a plurality of consecutive rows of the textile 6, so as to define in the textile 6 a predefined number of knitted fabric portions corresponding to the same knitting rows and having a differentiated yarn tension. The step of changing the elastic yarn tension 9 within the same knitting row during the production of the textile 6 is repeated in a plurality of consecutive rows of the textile 6 in different positions in at least some rows of the textile 6, so as to define in the textile 6 a predefined number of suitably shaped knitted fabric portions with a differentiated yarn tension. The step of changing the tension of the elastic yarn fed to the needles within the same knitting row during the production of the textile 6 can be repeated a predefined number of times at a plurality of non-consecutive rows of the textile 6, so as to define in the textile 6 a predefined number of knitted fabric portions having a differentiated yarn tension. Moreover, the step of changing the tension of the elastic yarn can be performed by selectively increasing and decreasing the tension of the elastic yarn in an alternating manner within each knitting row, alternating an increase with a respective successive decrease. As an alternative, the step of changing the tension of the elastic yarn can be performed by selectively increasing and decreasing the tension of the elastic yarn in an alternating manner within each knitting row, by alternating two consecutive increases with two respective successive consecutive decreases. Increases and decreases can further be repeated in the same sequence at a plurality of consecutive knitting rows, by performing the changes of elastic yarn tension in each row on the same point of the textile 6. As an alternative, increases and decreases can be repeated in the same sequence at a plurality of consecutive knitting rows, by performing the changes of elastic yarn tension in each row at variable points of the textile 6 so as to define shaped portions on the textile 6. In a variant, the step of changing the tension of the elastic yarn fed by the first feeding devices can be performed by varying the tension simultaneously on the first feeding devices 8. In another variant, the step of changing the tension of the elastic yarn fed by the first feeding devices can be performed by varying the tension in a time-offset manner on the first feeding devices. Moreover, the step of changing the tension of the elastic yarn fed by the first feeding devices can be performed according to the same predefined value of variation on the first feeding devices or, in another variant, according to different predefined values of variation for each first feeding device. The step of changing the tension of the elastic yarn 9 fed to the needles 4 by the first feeding device 8 is further preferably executed in a gradual manner so as to obtain the predefined value of variation of the tension of the elastic yarn 9 in a controlled manner in a predefined time interval and/or predefined space and/or at a predefined number of needles or stitches. In particular, in the step of changing the tension of the elastic yarn fed to the needles within the same knitting row, the tension of the elastic yarn can be varied, at least at a portion of the same knitting row or on a plurality of portions of the same knitting row, in a gradual manner between a respective initial and a respective final value so as to define a progressive increase or decrease of the tension of the elastic yarn in such a row portion or in such a plurality of portions of the same knitting row. The process can further comprise the step of defining in the textile a predefined number of knitted fabric portions with differentiated compression, each knitted fabric portion being defined by a respective sequence of knitting row portions having each a uniform elastic yarn tension within the knitting row portion, the process comprising the step of progressively or non-progressively varying the tension of the elastic yarn at least between some corresponding respective knitting row portions within at least one knitted fabric portion or within a plurality of knitted fabric portions. The process can further include the step of defining in the textile a predefined number of knitted fabric portions with differentiated compression, each knitted fabric portion being defined by a respective sequence of knitting row portions having each an elastic yarn tension varying in the knitting row portion, according to a respective progression of elastic yarn tension between a respective initial and a respective final value, wherein the process further comprises the step of progressively or non-progressively varying the tension of the elastomeric yarn at least between some corresponding successive knitting row portions within at least one knitted fabric portion or within a plurality of knitted fabric portions. Moreover, such progressive variation of tension can occur according to a suitable predefined increase or decrease profile, either linear or curved. It is thus possible to avoid too sudden and potentially dangerous variations of the tension of the elastic yarn 9, ensuring technically and aesthetically better results. The step of changing the tension of the elastic yarn 9 can be performed by means of suitable commands of the control device 11 for the operation of the knitting machine 1 sent to the first feeding device 8 of elastic yarn 9. As an alternative, such a step can be performed by means of suitable commands of the control device 11 sent to the braking and/or yarn 9 tension adjusting devices apt to enable to change the tension of the elastic yarn 9 fed to the needles 4 by the first feeding device 8 of elastic yarn 9. The process for manufacturing knitwear, hosiery textile items or seamless items with variable compression on circular weft knitting machines can further comprise the step of defining the program for the production of the textile 6 for the control device 11 of the knitting machine 1, by defining on a schematic representation of the textile 6 or drawing a predefined number of schematic areas 14, 15, 16, 17, 18, 19, 20 or drawing areas corresponding to portions 17a, 18a, 19a, 20a of the textile 6 designed to have a differentiated yarn tension. In a non-limiting example of embodiment, the area 17 can have an elastic yarn tension of grams, the area 18 a tension of 5 grams, the area 19 a tension of 20 grams, and the area 20 a tension of 30 grams. Obviously, the number and shape of the schematic areas 17, 20, 19, 20 and their grammage can be freely defined by a user according to the desired results. Such a definition of the schematic areas 17, 18, 19, 20, as schematically shown in FIG. 4, can be defined by means of a graphical interface which can be configured for allowing the definition e.g. of the size and shape of the portions 17a, 18a, 19a, 20a of the textile 6, and of the tension to be obtained in each area (e.g. by means of graphical conventions such as differently colored areas). The interface can be further configured for enabling the definition of the size of the transition areas in which the tension should vary between an initial and a final value, corresponding to two adjacent areas. As an alternative, the characteristics of these transition areas can be manually defined or automatically calculated by means of a dedicated program. In other words, in the example of FIG. 4, the system can automatically take into account the fact that the variations of elastic yarn tension cannot and/or should not be instantaneous and can then automatically calculate or enable to set the required transition areas for the desired variation in the desired place. This transition area will be symmetrically arranged in case of tension increase and decrease, i.e. it will be placed upstream from the desired point of increase and symmetrically placed downstream from the desired point of decrease, so as to enable to obtain a symmetry in the areas with differentiated compression. The embodiment of FIG. 5 shows other knitted areas in which yarn tension and the resulting effect of fabric compression are indicated by a different intensity of the color filling each area. In particular, it is provided for knitted areas 15 in which the tension of the elastic yarn is constant (indicated by a uniform color), knitted areas 14 in which yarn tension is gradually varied within each row portion constituting the area 14, going from a lower tension and compression to the right of the area in the figure to a higher yarn tension and thus fabric compression to the left of the area in the figure, and further with a suitable shaping of the knitted area 14. In particular, the progression of tension in each row portion is repeated in the same manner along the knitted portion, without further variations between a row and the following one, but the extension of the row portion is variable so as to define the shape of the knitted area 14 and thus also the progression of tension is performed at variable widths of the successive row portions. The example further shows knitted areas 16 in which, conversely, tension does not vary within the respective knitting row portions but gradually between a row and the following one, from a higher tension and compression in the lower portions of the areas 16 in FIG. 5 to a lower tension and compression in the upper portions of the areas 16 in FIG. 5. The invention further relates to a software for circular knitting machines for seamless items, hosiery and knitwear, configured for executing one or more steps of a process according to the above description. In particular, the software is configured at least for commanding to the control device 11 of the knitting machine the execution of the program for the production of the textile 6. The steps of the process as disclosed above can be performed by more than one software, e.g. some steps can be performed by a first operating software installed on the control device 11 of the knitting machine, and other steps by a second programming or design software (which may offer the user a drawing interface such as the one shown in FIG. 4) installed on an external computer to be operatively connected to the knitting machine 1 by means of a network or a portable storing device. The invention further relates to a knitting machine 1 as described above, in which the control device 11 is configured for executing at least some steps of the process as described above and/or has the first software mentioned above installed. The invention thus conceived can be subjected to several changes and variants, all of which fall within the inventive idea, and the components mentioned can be replaced by other technically equivalent elements. The invention can be applied to the production of various types of products, such as e.g.: underwear, corsetry, knitwear, hosiery, shaped panty girdles, technical items, sportswear, medical items, etc. The invention achieves important advantages. First of all, the invention enables to overcome at least some of the drawbacks of the known technique. The invention further enables to produce high quality textile items that are basically free of defects, and to reduce scraps. The invention further enables to produce variously shaped textile items according to the different needs and suiting to the body of each user. The invention also enables to produce textile items provided with areas with differentiated compression that are also potentially in a large number and small size, apt to provide highly diversified containment and compression effects of the different body areas, which can be suited to many different needs. The invention further enables to obtain shaped seamless textile items having areas with differentiated compression. The invention also enables to obtain shaped textile items having areas with differentiated compression automatically from the knitting machine, without the need for manual finishing operations involving cutting/sewing. The invention also enables to simplify the programming process for the textile and its areas with differentiated compression. The invention further enables to minimize the need for manual interventions by the operators in order to produce basically finished textile items. The invention also enables to produce textile items in a simple, fast and automatic manner. The invention is further simple, robust and cheap to obtain and ensures high standards in terms of repeatability and safety.

The invention claimed is:

1. A process for manufacturing knitwear, hosiery or seamless textile items with variable compression on circular weft knitting machines, comprising the steps of:
    providing at least one circular weft knitting machine (1) comprising at least: a bearing structure (2); a cylinder (3) of the needles (4) rotatably mounted in the bearing structure (2); a plurality of needles (4) supported by the cylinder (3) and movable parallel to an axis of rotation of the cylinder (3) to produce a knitted fabric; a plurality of stitch adjusting cams (7) operatively active upon said needles (4) to vary the width of the stitches produced by the needles; at least a first feeding device (8) of an elastic yarn (9) operatively active to supply the needles (4) with an elastic yarn (9) at a respective feeding position (10); a control device (11) of the operation of the knitting machine (1); and electric and electronic devices (12) connected to the control device (11) and operatively active to control the operation of a plurality of parts of the knitting machine (1) and to detect a plurality of operating parameters of the knitting machine (1);
    activating a program for manufacturing a knitwear or hosiery or a seamless textile item (6), on the control device (11) of the knitting machine (1); and
    manufacturing a knitwear, hosiery or seamless textile item (6) on the knitting machine; wherein the process further comprises the step of actively and automatically changing, according to a predefined program for manufacturing the textile item, the feeding tension of the elastic yarn (9) fed to the needles (4) at least by the first feeding device (8) according to a predefined value of variation and for a predefined number of times, corresponding to at least two times within the same knitting row during the production of the textile item (6), to define in said same knitting row of the textile item (6) a corresponding predefined number of distinct knitting row portions having a mutually differentiated yarn tension corresponding to at least two portions of the same knitting row.

2. The process according to claim 1, wherein the step of changing the tension of the elastic yarn (9) fed to the needles (4) is performed a predefined number of times corresponding to at least three times, or at least four times, or several times, within the same knitting row during the production of the textile item (6), to define in the same knitting row of the textile item (6) a corresponding predefined number of knitting row portions having a differentiated tension of the elastic yarn (9) and/or wherein the tension of the elastic yarn (9) is varied according to different predefined values of variation at successive variations in a same knitting row to define a plurality of knitting row areas having different tensions between them.

3. The process according to claim 1, wherein in the step of changing the tension of the elastic yarn (9) fed to the needles (4) within the same knitting row, the tension of the elastic yarn (9) is changed according to said predefined value of variation, between a respective initial and a respective final value, equal to at least 1 gram, or at least 2 grams, or at least 5 grams, or at least 10 grams, or at least 20 grams, or above, of grammage of the elastic yarn (9).

4. The process according to claim 1, wherein the step of changing the tension of the elastic yarn (9) fed to the needles (4) by the first feeding device (8) is gradually performed within at least the same knitting row, to obtain the predefined value of variation of the tension of the elastic yarn (9) in a controlled and progressive manner in at least one knitting row portion, or in a plurality of knitting row portions of the same knitting row or in each knitting row portion of the same knitting row and/or wherein in the step of changing the tension of the elastic yarn (9) fed to the needles (4) within the same knitting row, the tension of the elastic yarn (9) is gradually changed at least at a portion of the same knitting row or in a plurality of portions of the same knitting row, from a respective initial to a respective final value to cause a progressive increase or decrease of the tension of the elastic yarn (9) in such a row portion or in such a plurality of portions of the same knitting row.

5. The process according to claim 1, wherein the step of changing the tension of the elastic yarn (9) fed to the needles (4) within the same knitting row during the production of the textile item (6) is repeated a predefined number of times at a plurality of consecutive rows of the textile item (6), to define in the textile item (6) a predefined number of knitted fabric portions having a mutually differentiated tension of the elastic yarn (9) and each formed by a corresponding sequence of distinct knitting row portions having a differentiated tension of the elastic yarn (9) with respect to the adjacent knitting row portions.

6. The process according to claim 5, wherein the step of changing the tension of the elastic yarn (9) fed to the needles (4) within the same knitting row during the production of the textile item (6) is repeated, in a plurality of consecutive rows of the textile item (6), at different positions in at least some rows of the textile item (6), to defin in the textile item (6) a predefined number of suitably shaped knitted fabric portions with a mutually differentiated tension of the elastic yarn (9).

7. The process according to claim 1, further comprising the step of defining in the textile item (6) a predefined number of knitted fabric portions with differentiated compression, each knitted fabric portion being defined by a respective sequence of knitting row portions having each a uniform tension of the elastic yarn (9) within the knitting row portion, the process comprising the step of progressively or non-progressively varying the tension of the elastic yarn between at least some corresponding successive knitting row portions within at least one knitted fabric portion or within a plurality of knitted fabric portions.

8. The process according to claim 1, further comprising the step of defining in the textile item (6) a predefined number of knitted fabric portions with differentiated compression, each knitted fabric portion being defined by a respective sequence of knitting row portions having each a tension of the elastic yarn (9) varying within the knitting row portion, according to a respective progression of the tension of the elastic yarn (9), between a respective initial and a respective final value, wherein the process further comprises the step of progressively or non-progressively varying the tension of the elastomeric yarn at least between some corresponding successive knitting row portions within at least one knitted fabric portion or within a plurality of knitted fabric portions.

9. The process according to claim 8, wherein the step of changing the tension of the elastic yarn (9) fed to the needles (4) by the first feeding device (8) within at least the same knitting row and/or between more knitting rows, is performed gradually and progressively and/or in a predefined time interval and/or in a predefined space and/or at a predefined number of needles or stitches and/or according a predefined linear or curved profile of increase or decrease.

10. The process according to claim 1, wherein the step of changing the tension of the elastic yarn (9) is performed without varying the type of elastic yarn (9) and/or without varying the type of the knitted structure and defining, in the same knitting row, distinct knitting row portions having the same knitted structure and a differentiated tension of elastic yarn (9) and/or wherein the step of changing the tension of the elastic yarn (9) is performed by command of the control device (11) of the operation of the knitting machine (1) to the first feeding device (8) of elastic yarn (9) or to the braking and/or yarn (9) tension adjusting devices apt to change the tension of the elastic yarn (9) fed to the needles (4) by the first feeding device (8) of elastic yarn (9).

11. The process according to claim 1, further comprising the step of defining the program of production of the textile item (6) for the control device (11) of the knitting machine (1) by defining on a schematic representation of the textile item (6) or drawing a predefined number of schematic areas (14, 15, 16, 17, 18, 19, 20) or drawing areas corresponding to portions (17a, 18a, 19a, 20a) of textile item (6) destined to have a differentiated tension of the elastic yarn (9).

12. The process according to claim 1, wherein the first feeding device (8) of elastic yarn (9) is of passive type with rotatable reel or "défilé" type and/or wherein the elastic yarn (9) is a coated or bare or uncoated elastomeric yarn; or wherein the first feeding device (8) of elastic yarn (9) is of active type, PYF or "déroulé" type and/or wherein the elastic yarn (9) is a bare or uncoated elastomeric yarn.

13. The process according to claim 1, wherein the circular weft knitting machine (1) further comprises at least a second feeding device (8a) of a non-elastic yarn (9a), operatively active to supply the needles (4) with a non-elastic yarn (9a) at a respective feeding position (10), and wherein the textile item (6) is produced by the process, both using the elastic yarn (9) and the non-elastic yarn (9a).

14. A circular weft knitting machine comprising at least:
a bearing structure (2);
a cylinder (3) of the needles (4) rotatably mounted in the bearing structure (2);
a plurality of needles (4) supported by the cylinder (3) and movable parallel to an axis of rotation of the cylinder (3) to produce a knitted fabric;
a plurality of stitch adjusting cams (7) operatively active upon said needles (4) and selectively movable to vary the width of the stitches (5a) produced by the needles (4) at a respective feeding position (10) of an elastic yarn (9), at least a first feeding device (8) of an elastic yarn (9) operatively active to supply the needles (4) with an elastic yarn (9) at a respective feeding position (10) and on a respective one of said stitch adjusting cams (7);
a control device (11) of the operation of the knitting machine (1);
electric and electronic devices (12) connected to the control device (11) and operatively active to control the operation of a plurality of parts of the knitting machine (1) and to detect a plurality of operating parameters of the knitting machine (1);
the control device (11) being provided with a software configured for executing a process for manufacturing knitwear, hosiery or seamless textile items with variable compression, the process comprising the steps of:
activating a program for manufacturing a knitwear or hosiery or a seamless textile item (6), on the control device (11) of the knitting machine (1); and
manufacturing a knitwear, hosiery or seamless textile item (6) on the knitting machine, wherein the process further comprises the step of actively and automatically changing, according to a predefined program for manufacturing the textile item, the feeding tension of the elastic yarn (9) fed to the needles (4) at least by the first feeding device (8) according to a predefined value of variation and for a predefined number of times, corresponding to at least two times within the same knitting row during the production of the textile item (6), to define in said same knitting row of the textile item (6) a corresponding predefined number of distinct knitting row portions having a mutually differentiated yarn tension corresponding to at least two portions of the same knitting row.

15. The circular weft knitting machine according to claim 14, comprising at least a second feeding device (8a) of a non-elastic yarn (9a), operatively active to supply the needles (4) with a non-elastic yarn (9a) at a respective feeding position (10), to enable producing the textile item (6) with the elastic yarn (9) and with the non-elastic yarn (9a).

16. The circular weft knitting machine according to claim 14, the control device (11) being configured and programmed for executing a process for manufacturing knitwear, hosiery or seamless textile items with variable compression, the process comprising the steps of:
activating a program for manufacturing a knitwear or hosiery or a seamless textile item (6), on the control device (11) of the knitting machine (1); and
manufacturing a knitwear, hosiery or seamless textile item (6) on the knitting machine;
wherein the process further comprises the step of actively and automatically changing, according to a predefined program for manufacturing the textile item, the feeding tension of the elastic yarn (9) fed to the needles (4) at least by the first feeding device (8) according to a predefined value of variation and for a predefined number of times, corresponding to at least two times within the same knitting row during the production of the textile item (6), to define in said same knitting row of the textile item (6) a corresponding predefined number of distinct knitting row portions having a mutually differentiated yarn tension corresponding to at least two portions of the same knitting row.

\* \* \* \* \*